United States Patent [19]

Samuels et al.

[11] Patent Number: 4,686,015

[45] Date of Patent: Aug. 11, 1987

[54] NICKEL/INDIUM ALLOY AND METHOD OF USING SAME IN THE MANUFACTURE OF PRINTED CIRCUIT BOARDS

[75] Inventors: George J. Samuels, Syracuse; Joseph M. Garman, Williamsville, both of N.Y.

[73] Assignee: Allied Corporation, Morris Township, Morris County, N.J.

[21] Appl. No.: 876,148

[22] Filed: Jun. 19, 1986

Related U.S. Application Data

[60] Division of Ser. No. 714,849, Mar. 26, 1985, Pat. No. 4,626,324, and a continuation-in-part of Ser. No. 805,352, Apr. 30, 1984, abandoned.

[51] Int. Cl.⁴ ............................................. C25D 5/02
[52] U.S. Cl. .................................................... 204/15
[58] Field of Search .......................................... 204/15

[56] References Cited

U.S. PATENT DOCUMENTS 3,673,680 7/1972 Tanaka ................................. 204/15
4,135,988 1/1979 Dugan .................................. 204/15

Primary Examiner—T. M. Tufariello
Attorney, Agent, or Firm—Richard C. Stewart; Gerhard H. Fuchs

[57] ABSTRACT

An improved method of manufacturing printed circuit boards of the type in which a metal clad substrate is covered with a photoresist, the photoresist is masked with a predetermined circuit image, the photoresist is exposed and the exposed photoresist is removed to provide a circuit image on the surface of the metal, the circuit image is electroplated with a metallic etch resist and the remaining photoresist and exposed metal cladding is removed to provide a board having a metal circuit covered by a metallic etch resist, the improvement comprising a metallic etch resist composed of a nickel/indium alloy containing from about 0.1 to about 10 weight percent indium based on the total weight of the alloy.

19 Claims, 10 Drawing Figures

NICKEL/INDIUM ALLOY AND METHOD OF USING SAME IN THE MANUFACTURE OF PRINTED CIRCUIT BOARDS

RELATED APPLICATIONS

This application is a divisional application of U.S. patent application Ser. No. 714,849 filed Mar. 26, 1985 now U.S. Pat. No. 4,626,324 which is a continuation-in-part application of U.S. patent application Ser. No. 805,352, filed Apr. 30, 1984, abandoned.

BACKGROUND OF THE INVENTION (1) Field of Art

This invention relates to a novel solderable alloy of nickel and indium which is useful in the manufacture of electrical devices, and to an electroplating bath for use in the manufacture of such alloy. Yet another aspect of this invention relates to printed circuit boards in which the nickel/indium alloy of this invention is used as the etch resist, and as a protective coating over the copper circuits. Yet another aspect of this invention relates to a printed circuit board and other electrical devices in which the circuitry is composed of a nickel/indium alloy. Still another aspect of this invention relates to a method of preparing such printed circuit boards and printed circuit boards prepared by such method. Other aspects of this invention will become apparent from a purview of the specification and appended claims.

(2) The Prior Art

Printed circuit boards are widely used by the modern electronics industry as interconnecting devices. Prior art manufacturing processes for manufacturing such boards are characterized as subtractive, additive, or semi-additive.

The general technique for forming printed circuit boards by means of subtractive processing is well known. Examples of the subtractive process are described in detail in U.S. Pat. Nos. 3,673,680 and 4,135,988. In one modification of the subtractive process, a copper laminated substrate (after an appropriate preparatory step, as for example cleaning) is covered with a layer of protective photoresist. The photoresist layer is subsequently masked with a desired circuit pattern, and exposed to a source of energy, such as a source of ultraviolet radiation. Where struck by the ultraviolet radiation, the photoresist is polymerized and made insoluble in the developer. The preselected circuit pattern or image areas are revealed when unexposed portions of the photoresist are washed away by developer. Additional copper is then deposited on the bare copper which had been covered by the unexposed portion of the photoresist through use of standard electroplating techniques, followed by electrodeposition of a 60/40 tin/lead alloy etch resist in a thickness of from about 10 to about 15 microns also using such standard techniques. The remaining photoresist is then removed. The surface of the copper clad laminate now consist of areas of bare copper which are etched away through use of a standard etchant, as for example an alkaline etchant such as ammoniacal copper, and acidic etchants such as hydrogen peroxide in sulfuric acid, and areas of copper which are protected from the etchant by the productive metallic etch resist. After etching, the tin/lead alloy covering the copper circuits is then reflowed to provide bright homogenous circuits suitable for soldering. After soldering, residues of flux can be removed.

In addition, the printed circuit can be drilled to provide holes therein, drilling being carried out at any convenient stage in the process, as for example after the initial cleaning of the copper laminate. If the printed circuit is to be double-sided with plated through holes which establish electrical contact between a copper circuit one side and a copper circuit on the other side, then the inside surfaces of the drilled holes are cleaned and coated with catalyst, e.g., a palladium/tin catalyst, and a thin layer of copper or other suitable electrically conductive material is then deposited on the inside surfaces of the holes by an electroless plating techniques. Further, additional electrically conductive material can be electroplated onto the first layer of electroplated material to provide a thickness of electrically conductive material sufficient to carry the required electrical current. If components are to be mounted on the printed circuit board using a flowing solder technique, e.g., using a wave soldering machine, then a solder mask is printed over those parts of the copper circuit which are not to receive solder. As an alternative to electroplating a tin/lead alloy over the hole of the copper circuit the tin/lead alloy can be selectively plated only onto those parts of the circuit which are to receive solder. This alternative technique involves printing a different etch resist on those parts of the circuit not covered by the tin/lead alloy which leads to registration and other problems.

In the semi-additive process for manufacture of printed circuit boards, through-holes are drilled in an insulating substrate, followed by activation of the substrate and through-holes with an activating solution typically containing noble metal ions. This is then followed by the deposition of electroless copper on top of the substrate and on the walls of the formed holes, accomplished by immersion in an electroless copper plating solution. Thereafter, a first resist, such as a photoresist or screen printable resist is applied to the formed board in the negative image of the desired circuit pattern leaving exposed those regions of the electroless copper corresponding to the desired circuit pattern. A copper layer is then electroplated on top of the exposed electroless copper portions, including the hole walls. The first resist is removed and the structure is immersed for a time in a copper etchant which removes the uncovered electroless copper. Alternatively, the electroplated surfaces of the substrate can be electroplated with a second etch resist such as silver, tin, lead or gold to cover the surfaces of the electroplated copper prior to removal of the first resist followed by removal of the first resist and etching of the copper. The copper underlying the second etch resist forms the desired circuit on the circuit board.

These known substractive and semi-additive processes of producing printed circuits, and particularly printed circuits with plated through holes are relatively complex and involve a large number of different steps, require energy for the removal of the tin/lead alloy from those portions of the copper circuit in the edge contact area and for the reflowing of the tin/lead alloy, and are relatively expensive. Moreover, the printed circuits produced by these known methods are unsatisfactory in that during flow soldering of components to the printed circuit the tin/lead alloy, which has a low melting point of 190° C., tends to run under the solder mask under the heat of the soldering operation (usually about 230° C.) potentially causing a short circuit and maring the appearance of the printed circuit with the components mounted thereon.

SUMMARY OF THE INVENTION

This invention provides a novel nickel/indium alloy which contains an "effective amount" of indium. The alloy of this invention obviates many of the disadvantages associated with prior art methods of manufacturing printed circuit boards encountered when conventional tin/lead solder is used as the etch resist. For example, the novel nickel/indium alloy of this invention has a melting point which is much higher than the soldering temperature used to solder components onto the furnished printed circuit board. Accordingly, the melting or reflowing problem encountered with tin/lead solder resists is obviated. Furthermore, a further advantage of the nickel/indium alloy of this invention is that it is highly conductive and it is solderable. Thus, the alloy of this invention need not be removed from the circuit board after etching and can remain a permanent part of its construction to protect the underlying copper circuits.

Moreover the novel nickel/indium alloys of this invention exhibit superior corrosion resistance and contact resistance. Thus, the alloy can be use as a total or partial replacement of gold in edge contact areas for printed circuits or other electrical devices.

Another aspect of this invention relates to printed circuit boards of which the novel nickel/indium alloy of this invention is a part, or during the construction of which is used as an etch resist. Yet another aspect of this invention relates to the process of manufacturing printed circuit boards and other electrical devices through use of the novel alloy of this invention. Still another aspect of this invention relates to a novel and unique plating bath for use in the electrodeposition of the novel nickel/indium alloy of this invention.

The method and alloy of the present invention enables savings to be made in the number of process steps required, the plant and equipment necessary to carry out those process steps, with consequent savings in floor space, energy, and the amount of gold used, as well as providing a printed circuit which is more aesthetically pleasing in appearance and which is not marred by molten metal running under the soldering mask when components are mounted thereon by a flow soldering technique. Finally nickel/indium alloys are very suitable for providing touch-sensitive surfaces, e.g., touch-sensitive switches, when plated onto the circuits of a printed circuit.

DETAILED DESCRIPTION OF THE INVENTION

Figure 1:
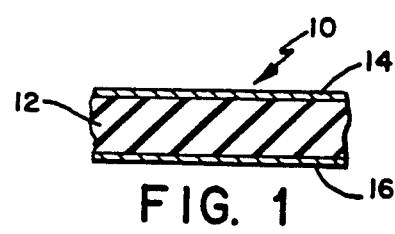
FIGS. 1 to 10 are a series of fragmentary sectional views corresponding to successive process steps in the preparation of a printed circuit board with plated through holes in accordance with the present invention.
Figure 6:
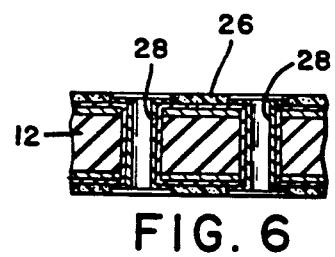

The novel nickel/indium alloy of this invention comprises an "effective amount" of indium. As used herein, "an effective amount" of indium is an amount which is sufficient to render the nickel/indium alloy solderable. The nickel/indium alloy has a melting point such that the alloy does not reflow during printed circuit board manufacture and is resistant to conventional copper etchants used in printed circuit board manufacture. Generally, all or a portion of these alloy characteristics can be achieved where the alloy contains upto about 10 weight percent of indium by weight of the alloy. In the preferred embodiments of the invention, the alloy will contain from about 0.1 to about 10, and in the particularly preferred embodiments the alloy will contain from about 0.3 to about 9 weight percent on the aforementioned basis. Amongst these particularly preferred embodiments of the invention, alloys which contain from about 0.5 to about 7 weight percent indium by weight of the alloy are especially useful as etch resist in the manufacture of printed circuit boards, and those alloys which contain from about 1 to about 4 weight percent indium by weight of the alloy are most preferred for this application.

The nickel/indium alloy of this invention can be prepared by electrodepositing same from the novel plating bath of this invention, preferably on to a conducting metal, as for example copper, employing conventional electrodeposition techniques. Useful electrodeposition techniques including rack plating. Such conventional techniques which are described in detail in "Printed Circuit Handbook" by C. F. Coombs, Jr., 2nd Ed., McGraw-Hill Book Company, NY, N.Y. (1979); the "Handbook of Printed Circuit Design, Manufacture, Components and Assembly" by G. Leonida Electrochemical Publication, Ltd. Ayr Scotland (1981) and "Electroplating Engineering Handbook" by A. Kenneth Graham, Ed. Van Nostrand Reinhold Co., NY, N.Y. (1971) are well known in the electroplating art and will not be described herein in any great detail. The novel bath of this invention is especially useful because it provides for relatively constant alloy % composition with widely varying operating conditions of pH, current density and temperature.

The novel bath of this invention which can be used in the manufacture of the novel alloy of this invention comprises:

(a) at least about 0.5M nickel cations and at least about 0.001M indium cations;
(b) up to about 2.6M chloride ions;
(c) a buffer material in an amount sufficient to maintain the bath pH of equal to or less than about 5;
(d) an "effective amount of" a chelating material; and
(d) water.

In the preferred embodiments of this invention, the concentration of nickel cations and indium cations in the bath are, respectively, from about 0.5M to about 2.5M, and from about 0.001 to about 1M. In the particularly preferred embodiments of the invention, the concentration of nickel cations and indium cations in the bath are from about 0.5M to about 2.0M, and from about 0.009M to about 0.1M, respectively. Amongst these particularly preferred embodiments, most preferred are those embodiments in which the concentration of nickel cations and indium cations in the bath are, respectively, from about 1M to about 2M, and from about 0.015M to about 0.06M.

The bath of this invention includes one or more chelating agent capable of chelating indium cations. The types of chelating agents employed in the conduct of this invention can vary widely. For example, useful chelating agents include chelating agents capable of chelating ferric iron ($Fe^{3+}$). Illustrative of such chelating agents are those described in Ramunas J. Matekaitis and Arthur E. Martell, *Inorganic Chemistry*, 1980, 19, pp. 1646–1651; Wesley R. Harris and Arthur E. Martell, *Inorganic Chemistry*, 15, 713 (1976); and Martell, A. E. and Smith, R. M., "Critical Stability Constants", Fe(III)

and include the following compounds: adipyl, suberyl, sebacyl, dodecanedioyl, gluconic acid, saccharic acid, glyceric acid, bicine, catechol, iminodiacetic acid, nitrilotriacetic acid, ((hydroxyethyl)imino) diacetic acid, cyclohexanediamine tetraacetic acid, diethylenetriaminepentaacetic acid, salicyclic acid, chromotropic acid, hydroxamic acid, N,N'-bis(O-hydroxybenzyl)-ethylenediamine-N,N'-diacetic acid, ethylene-1,2-bis(O-hydroxy)phenylglycine, N-hydroxybenzyliminodiacetic acid, N-hydroxyethylethylenediamine-N,N', N'-triacetic acid, N,N'-ethylenediaminediacetic acid, N,N-ethylenediaminediacetic acid, N,N-bis(2-aminoethyl)glycine, N,N'-diglycylethylenediamine-N'',N'''-tetraacetic acid, N-hydroxyethyliminodiacetic acid, N-(2-hydroxy-5-sulfobenzyl)ethylenediamine-N,N'-bis(methylenephosphoric) acid, triethylene tetramine hexaacetic acid, tetraethylene pentamine heptaacetic acid, ethylenediamine-N,N'-diacetic-N-N'-bis(methylenephosphonic) acid, glycine-N,N'bis(methylene phosphonic) acid, ethylenediamine-N,N'-bis(methylene phosphonic) acid, 1-hydroxy-thane-1,1-disphosphonic acid, (2-hydroxybenzyl)imino bix-(methylene phosphonic) acid, ethylenediamine-N,N,N',N'-tetrakis(-methylene phosphonic) acid, and N-(phosphonomethyl)iminodiacetic acid. Other useful chelating agents for use in the practice of this invention include polycarboxylic acids having one or more carboxy functions ("carboxylic acids"), carboxylic acids having one or more carboxy functions and one or more hydroxy functions, ("hydroxycarboxylic acids") and carboxylic acids having one or more amino functions and one or more carboxyl functions ("aminocarboxylic acids") and salts thereof. Illustrative of such materials are: citric acid, malonic acid, tartaric acid, adipic acid, phthalic acid, oxalic acid, glutaric acid, isophthalic acid, maleic acid, fumaric acid, succinic acid, glycolic acid, glyoxylic acid, glutamic acid, glyceric acid, malic acid, lactic acid, hydroxybutyric acid, mandelic acid, valine, arginine, aspartic acid, pyruric acid, glutamine, leucine, lysine, threonine, isoleucine, valine and asparagin. The chelating agents can be used alone, or combinations of chelating agents can be employed. For example, varying amounts of a relatively strong chelating agent such as ethylene diamine tetraacetic acid can be used in combination with varying amounts of one or more relatively weak chelating agents such as malonic acid, citric acid, malic acid and tartaric acid to control the amount of "electroactive indium", that is, the amount of indium which is available for electroplating.

Preferred chelating agents for use in the practice of this invention are relatively weak chelating agents such as carboxylic acids, as for example, malonic acid and tartaric acids, hydroxy carboxylic acids, as for example, citric acid and malic acid and their salts. Hydroxy carboxylic acids and their salts are particularly preferred for use, and citric acid, malic acid and their salts are most preferred.

The use of the chelating agent is believed critical for the electrodeposition of nickel/indium alloy having acceptable properties, and also for control over the amount of indium in the alloy and the variance of such amount as a function of the effective current density. While we do not wish to be cound by any theory, it is believed that proper selection of a chelating agent or combination of more than one chelating agents can effectively control the amount of indium species available for plating at relatively constant value over a relatively broad operating time. Thus, the use of such chelating agents provides for a means of control of the percentage of indium in the plate.

An "effective amount" of one or more chelating agents is included in the bath. As used herein, "an effective amount" of chelating agent is an amount which is effective for control of the amount of electroactive indium to any extent. The amount of the chelating agent can vary widely depending on a number of factors, including the type of chelating agent employed, the amount of electroactive indium desired, the desired concentration of indium in the plate, current density, the pH, etc. In general, the amount of chelating agent is at least about 0.001M. In the preferred embodiments of the invention, the amount of chelating agent is from about 0.001M to about 2.6M, and in the particularly preferred embodiments, is from about 0.005M to about 1.6M. Amongst these particularly preferred embodiments of the invention, most preferred are those embodiments in which the amount of chelating agent in the bath is from about 0.05M to about 0.25M.

The nickel and indium cations for use in the plating bath used in this invention can be derived from any source. In the preferred embodiments of the invention, the nickel and indium cations are derived from nickel and/or indium chloride, nickel or indium carbonatea, water-soluble nickel and/or indium salts of sulfamic acid, as well as hydroxycarboxylic acids, carboxylic acids, aminocarboxylic acids, which do not contain mercapto functions, and like nickel and/or indium salts which can also function as chelators. Illustrative of useful water-soluble nickel and indium salts are the nickel and indium salts of citric acid, acetoacetic acid, glyoxylic acid, pyruric acid, glycolic acid, malonic acid, hydroxamic acid, iminodiacetic acid, salicylic acid, glyceric acid, succinic acid, malic acid, tartaric acid, hydroxybutyric acid, arginine, aspartic acid, asparagine, glutamic acid, glycine, glutamine, leucine, lysine, threonine, isoleucine, valine, and the like. In the preferred embodiments of the invention, the nickel and indium salts of sulfamic acid are employed as the source of nickel and indium, and in the particularly preferred embodiments of the invention, nickel and indium salts of sulfamic are used as the sources of nickel and indium.

The concentration of chloride ions in the bath is from 0 to about 2.6M. The chloride ions may be obtained from any metal salt which will not electrodeposit under the operational conditions of the bath or from nickel and/or indium salts. Illustrative of such useful metal salts are sodium and potassium chloride, non-metal salts such as ammonium chloride, nickel or indium chloride and the like. The chloride ions are preferably derived from indium and/or nickel chloride, with nickel chloride being a particularly preferred source of chloride ions. In the preferred embodiments of the invention, the concentration of chloride ions in the bath is from about 0.001M to about 2.6M, and in the particularly preferred embodiments, the concentration of chloride ions in the bath is from about 0.005M to about 1.6M. Amongst these particularly preferred embodiments, most preferred are those embodiments in which the concentration of chloride ions in the bath is from about 0.05M to about 0.25M.

The plating bath of this invention usually has a pH equal to or less than about 5, preferably from about 1.4 to about 5.0, most preferably from about 2.3 to about 3.6. The pH of the plating bath can be maintained at the desired pH by the use of buffer materials. The type of buffer material used can vary widely, depending on the desired pH. For example, the pH can be maintained within the preferred pH range through use of such materials as boric acid, or can be adjusted by addition of basic materials, such as ammonium hydroxide, nickel carbonate, sodium hydroxide, triethylamine, triethanolamine, pyridine, sodium carbonate, and the like. The pH can also be adjusted through use of carboxylic acids, amino carboxylic acids or the hydroxy carboxylic acids, when such an acid or its salt is the chelating agent. The particular pH employed in the particularly preferred embodiments of the invention will depend on the particular buffer material used. For example, where a hydroxy carboxylic acid, such as citric acid, is the buffer material and chelating agent of choice, sufficient material is used to maintain the pH from about 1.4 to about 4.7, and preferably from about 1.8 to about 3.8. In the particularly preferred embodiments of the invention where a hydroxy carboxylic acid is used as the buffer material and chelating agent, the pH may vary from about 2.0 to about 2.8, and in the most preferred embodiments of the invention where a hydroxy carboxylic acid is used as the buffer material and chelating agent, the pH may vary from about 2.1 to about 2.7. On the other hand, experimentation has shown that best results are obtained when boric acid is the buffer material of choice if the pH is maintained in the range of from about 1.5 to 3.5. In the preferred embodiments of the invention where boric acid is the buffer material of choice, the pH may vary from about 2.0 to about 3.0, and in the particularly preferred embodiments the pH may vary from about 2.5 to about 3.0. In the most preferred embodiments of the invention in which boric acid is the buffer material of choice, the pH can vary from about 2.8 to 3.0.

In the preferred embodiments of the invention, the nickel/indium alloy is electrodeposited from the bath of copending U.S. patent application Ser. No. 605,352, entitled "Novel Nickel/Indium Alloy and Method of Using Same in the Manufacture of Printed Circuit Boards", filed Apr. 30, 1984. In the preferred bath of this invention, a combination of chelating agent and buffer selected from the group consisting of carboxylic acids, hydrocarboxylic acids and salts thereof are employed. In general, such preferred baths will comprise:

(a) at least about 0.9M nickel cations and at least about 0.001M indium cations;
(b) up to about 2.6M chloride ions;
(c) from about 0.25M to about 1.6M of a combination buffer material and chelating agent selected from the group consisting of carboxylic acids, hydroxycarboxylic acids and salts thereof; and
(d) water.

An especially efficacious plating bath for use in the practice of this invention comprises:

(a) from about 0.9M to about 2.0M of nickel ions;
(b) from about 0.4M to about 2.5 chloride ions;
(c) from about 0.004M to about 0.05M of indium ions;
(d) from about 0.2M to about 1M of a combination buffer material and chelating agent selected from the group consisting of carboxylic acids, hydroxy carboxylic acids and salts thereof, either alone or in combination with other chelating agents; and
(e) water.

The bath of this invention may include other optional ingredients which are normally used with or incorporated into plating baths. For example, the plating bath of this invention may include one or more compounds to reduce surface pitting, such as alkyl sulfonic acid salts and the like. Other optional materials which may be included in the bath of this invention are dextrose type stabilizers for indium. Additionally other alloy modifying agents, such as saccharin and counarin which affect the alloy characteristics such as internal stress and appearance of the alloy electroplated can also be included in the bath.

During electrodeposition procedure, the plating bath is normally maintained at a temperature of from about 10° C. to about 80° C. In the preferred embodiments of the invention, the electrodeposition temperature is from about 20° C. to about 65° C., and in the particularly preferred embodiments of the invention the electrodeposition temperature is from about 35° C. to about 65° C. Amongst these particularly preferred embodiments of the invention, most preferred are those embodiments in which the electrodeposition temperature is from about 35° C. to about 55° C.

In the electrodeposition procedure current densities can vary widely. However, in most embodiments of the invention the current density is usually maintained within the range of from about 1 to about 200 milliamperes per $cm^2$. In the preferred embodiments of the invention, the current density is from about 5 to about 100 milliamperes per $cm^2$, and in the particularly preferred embodiments is from about 10 to about 60 milliamperes per $cm^2$. Amongst these particularly preferred embodiments, the most preferred are those embodiments in which the current density varies from about 20 to about 40 milliamperes per $cm^2$.

The electrodeposition process is carried out for a period of time sufficient to electrodeposit the desired amount of the nickel/indium alloy. As will be apparent to one of skill in the relevant art, electrodeposition times may vary widely depending on a number of factors including but not limited to the desired thickness of the electroplate, current density, bath temperature and the like. Electrodeposition times typically vary from a few minutes to several hours or more.

The nickel/indium alloy of this invention is particularly useful in the construction of electrical devices, as for example printed circuit boards, electrical circuits in electrical devices, electrical connectors, chip carriers, switches and the like. For example, the nickel/indium alloy of this invention can be used as an etch resist in the manufacture of printed circuit boards by the subtractive process, and the semi-additive process. The general technique of forming printed circuit patterns by means of the subtractive process is very well known in the art. Examples of the subtractive process are described in detail in U.S. Pat. Nos. 3,673,680 and 4,135,988. This invention provides an improvement in the subtractive process for manufacturing printed circuit boards of the type which comprises (a) covering one or more surfaces of a copper clad substrate with a coating of a photoresist material; (b) masking the photoresist material with a predetermined circuit design image; (c) exposing the photoresist material to a source of energy to provide a resist layer portion susceptible to an etchant over a desired circuit image on said one or more surfaces and resist layer portion resistant to said etchant over the remainder of said surfaces; (d) removing those portions of the photoresist material which are susceptible to the etchant to provide a desired exposed pattern of bare copper surface; (e) electroplating a metallic etch resist over the electroplated copper; (f) removing the remaining portion of the photoresist from said board exposing a portion of the copper cladding and (g) etching away the exposed copper cladding which was under the photoresist of step (g) while not removing the copper cladding under the said metallic etch resist a board having copper circuit covered by a metallic etch resist, said improvement comprising a metallic etch resist of a nickel/indium alloy containing at least about 0.1 weight percent indium by weight of the alloy.

This invention also provides an improvement in the semi-additive process of the type which comprises the steps of:
(a) electrolessplating a metal plate onto at least one surface of a substrate composed of an insulating material;
(b) applying to a portion of said metal plating a protective material to provide the desired circuit pattern on said surfaces of the metal plating;
(c) electroplating the desired circuit pattern with a metal plating;
(d) electroplating said pattern with a metallic etch resist;
(e) removing said protective material from said metal plated substrate; and
(f) etching said metal from all or a part of the portion of metal cladding not covered by said etch resist to provide a board having the desired metal circuit pattern on at least one surface thereof; wherein improvement comprising a metallic etch resist of a nickel/indium alloy containing up to about 10 weight percent indium by weight of the alloy.

In the above referenced semi-additive process, the substrate is usually electroplated with copper metal. However, the substrate can also be plated with nickel and built up in step c by electroplating the circuit pattern with nickel/indium alloy. Nickel/indium alloy used in the formation of the circuit pattern will usually contain from about 0.1 to about 95 weight percent indium based on the total weight of the alloy, and will preferably contain from about 5 to about 20 weight percent indium on the same basis.

When used as an etch resist, the alloy will be deposited to a thickness necessary to protect the circuits from the etchant. Generally, the thickness of the electrodeposit will depend on the etching strength of the etchant and other factors known to those of skill in the art. It has been found that good results are achieved if the average thickness of the electrodeposit is at least about 0.1 mil (0.000254 cm). In the preferred embodiments of the invention, the thickness of the electrodeposit is at least about 0.2 mil (0.000508 cm) and in the particularly preferred embodiments in at least about 0.3 mil (0.000762 cm). Amongst these particularly preferred embodiments most preferred are those embodiments in which the electrodeposited alloy is at least about 0.4 mil. (0.00102 cm) thick.

The following specific examples are presented to more particularly describe the invention.

EXAMPLE I

General Procedure

Standardized commercially available nickel sulfamate ($Ni(SO_3NH_2)_2$) solution (2.55M of nickel sulfamate) is partially diluted with deionized water or distill water so that the remainder of the bath components can be readily dissolved. Nickel chloride is added along with boric acid, citric acid, diammonium citrate or a mixture of citric acid and diammonium citrate. The pH is then adjusted to slightly greater that the desired pH of the working bath by addition of sulfamic acid, a mixture of nickel carbonate and ammonium hydroxide, sodium hydroxide, potassium hydroxide, or hydrochloric acid. Next, indium sulfamate ($In(SO_3NH_2)_3$) as a hydrated salt is added, followed by the addition of a trace amount of a wetting agent (sodium lauryl sulfate). The bath is now brought to a volume of 1 liter by addition of distilled or deionized water and is ready to use. Using the above described procedure, a number of plating baths were prepared, the physical parameters of which are set forth in the following Table I.

TABLE I

| Bath No. | Bath pH | ML $Ni(SO_3NH_2)_2$ Solution | Moles $In(SO_3NH_2)_3 \cdot XH_2O$ | Moles $NiCl_2 \cdot 6H_2O$ |
|---|---|---|---|---|
| 1 | 4.0 | 405 | 0.0068 | 0.422 |
| 2 | 4.0 | 515 | 0.0068 | 0.140 |
| 3 | 3.5 | 460 | 0.0089 | 0.282 |
| 4 | 2.5 | 515 | 0.0127 | 0.146 |
| 5 | 2.5 | 405 | 0.0068 | 0.422 |
| 6 | 4.0 | 515 | 0.0127 | 0.140 |
| 7 | 4.0 | 405 | 0.0068 | 0.422 |
| 8 | 2.5 | 405 | 0.0127 | 0.422 |
| 9 | 4.0 | 405 | 0.0127 | 0.422 |
| 10 | 2.5 | 515 | 0.0127 | 0.140 |
| 11 | 3.5 | 460 | 0.0089 | 0.282 |
| 12 | 2.5 | 515 | 0.0068 | 0.140 |
| 13 | 3.5 | 515 | 0.0089 | 0.140 |
| 14 | 1.6 | 515 | 0.0089 | 0.140 |
| 15 | 1.45 | 515 | 0.0089 | 0.140 |
| 16 | 1.45 | 515 | 0.0089 | 0.140 |
| 17 | 1.45 | 515 | 0.0089 | 0.140 |
| 18 | 1.45 | 515 | 0.0089 | 0.140 |
| 19 | 1.45 | 515 | 0.0089 | 0.140 |
| 20 | 1.45 | 515 | 0.0089 | 0.140 |
| 21 | 1.45 | 515 | 0.0089 | 0.140 |
| 22 | 1.45 | 515 | 0.0089 | 0.140 |
| 23 | 1.80 | 515 | 0.0089 | 0.140 |
| 24 | 2.55 | 515 | 0.0089 | 0.140 |
| 25 | 2.50 | 515 | 0.0089 | 0.140 |
| 26 | 2.50 | 515 | 0.0089 | 0.140 |
| 27 | 2.90 | 515 | 0.0089 | 0.140 |
| 28 | 3.25 | 515 | 0.0089 | 0.140 |

| Bath No. | M of Boric Acid | M of Citric Acid | M of Sodium Lauryl Sulfate | M of Diammonium Citrate | Current density $mA/cm^2$ | Bath temperature °C. |
|---|---|---|---|---|---|---|
| 1 | 0.63 | — | 0.00018 | — | 75 | 60 |
| 2 | 0.63 | — | 0.00147 | — | 25 | 30 |
| 3 | 0.63 | — | 0.00073 | — | 50 | 45 |
| 4 | 0.63 | — | 0.00018 | — | 25 | 60 |
| 5 | 0.63 | — | 0.00147 | — | 25 | 60 |
| 6 | 0.63 | — | 0.00147 | — | 75 | 60 |
| 7 | 0.63 | — | 0.00078 | — | 75 | 60 |
| 8 | 0.63 | — | 0.00147 | — | 75 | 30 |
| 9 | 0.63 | — | 0.00018 | — | 25 | 30 |
| 10 | 0.63 | — | 0.00018 | — | 25 | 60 |
| 11 | 0.63 | — | 0.00073 | — | 50 | 45 |
| 12 | 0.63 | — | 0.00018 | — | 75 | 30 |
| 13 | 0.63 | — | 0.00073 | — | 50 | 45 |
| 14 | — | 0.63 | 0.00073 | — | 75 | 45 |
| 15 | — | 0.25 | 0.00073 | 0.38 | 75 | 45 |
| 16 | — | 0.25 | 0.00073 | 0.38 | 97 | 45 |
| 17 | — | 0.25 | 0.00073 | 0.38 | 75 | 45 |
| 18 | — | 0.25 | 0.00073 | 0.38 | 60 | 45 |
| 19 | — | 0.25 | 0.00073 | 0.38 | 40 | 45 |
| 20 | — | 0.25 | 0.00073 | 0.38 | 25 | 45 |
| 21 | — | 0.25 | 0.00073 | 0.38 | 10 | 45 |
| 22 | — | 0.25 | 0.00073 | 0.38 | 5 | 45 |
| 23 | — | 0.25 | 0.00073 | 0.38 | 75 | 45 |
| 24 | — | — | 0.00073 | 0.63 | 75 | 45 |
| 25 | — | — | 0.00073 | 0.63 | 75 | 45 |
| 26 | — | — | 0.00073 | 0.63 | 50 | 45 |
| 27 | — | — | 0.00073 | 0.63 | 75 | 45 |
| 28 | — | — | 0.00073 | 0.63 | 75 | 45 |

Using the plating baths of Table I, various nickel/indium alloys were electroplated on to a substrate. The apparatus used in these experiments consisted of a Hull cell equipped with a heater, a PAR power supply, a circulating pump and a flow meter. Samples were plated in duplicate on a 10 cm² exposed area of copper strip and also on a one ounce copper laminate. A total of 300 coulombs was passed for each run.

These electroplating experiments and the resulting nickel/indium alloy were evaluated and graded as follows:

1. Plate Appearance—Six people judged the appearance.
2. Plate Composition—X-ray fluorescence was used to obtain the % nickel and % indium in each plate. The analysis was performed at three locations on the plate (upper third, middle, and lower third) and an average was taken. The variation of the composition is also listed
3. Solderability-Contact Angle—This measurement was obtained by the placement of solder balls onto the fluxed plated surface and after applying heat, measuring the angle of contact between the solder and the alloy surface.
4. Etch Resistance—The etch resistance was judged as a pass/fail measurement of whether the alloy plate was adversely affected by a 65° C. 200 g/L ammonium persulfate solution after 10 minutes.

The operating parameters for these experiments and the results of the evaluation of the resulting nickel/indium alloys electrodeposited from the Boric Acid System are set forth in the following Table II, the resulting nickel/indium alloys electrodeposited from the Citric Acid and/or Diammonium Citrate System are set forth in the following Table III.

TABLE II

Boric Acid System

| Bath No. | Current mA/cm² | Bath Temperature °C. | Etch Resistance |
|---|---|---|---|
| 1 | 75 | 60 | Passed |
| 2 | 25 | 30 | Passed |
| 3 | 50 | 45 | Passed |
| 4 | 25 | 60 | Passed |
| 5 | 25 | 60 | Passed |
| 6 | 75 | 60 | Passed |
| 7 | 75 | 30 | Passed |
| 8 | 25 | 30 | Passed |
| 9 | 75 | 30 | Passed |
| 10 | 50 | 45 | Passed |

| Bath No. | Solderability (Contact Angle) | Plate Composition % Ni | Plate Composition % In | Plate* Appearance |
|---|---|---|---|---|
| 1 | 13° | 98.2 | 1.8 | Gray Matte |
| 2 | 17° | 98.0 | 2.0 | Gray Matte |
| 3 | 14° | 97.7 | 2.3 | Gray Matte |
| 4 | <4 | 94.2 | 5.8 | Gray Matte |
| 5 | 4 | 98.1 | 1.9 | Gray Matte |
| 6 | 8 | 97.95 | 0.05 | Gray Matte |
| 7 | 16 | 98.0 | 2.0 | Gray Matte |
| 8 | 15 | 98.9 | 1.2 | Gray Matte |
| 9 | 17 | 98.7 | 1.3 | Gray Matte |
| 10 | 15 | 98.3 | 1.7 | Gray Matte |

*All the plates were matte gray, but they varied in appearance from a light dark to dark gray.

TABLE III

Citric Acid and/or Diammonium Citrate System

| Bath No. | Current mA/cm² | Bath Temperature °C. | Etch Resistance |
|---|---|---|---|
| 13 | 50 | 20 | Passed |
| 14 | 75 | 20 | Failed |
| 15 | 75 | 20 | Passed |
| 16 | 97 | 20 | Passed |
| 17 | 75 | 20 | Passed |
| 18 | 60 | 20 | Passed |
| 19 | 40 | 20 | Failed |
| 20 | 25 | 20 | Failed |
| 21 | 10 | 20 | Failed |
| 22 | 5 | 20 | Failed |
| 24 | 75 | 20 | Passed |
| 25 | 75 | 20 | *Failed |
| 26 | 75 | 20 | *Failed |
| 27 | 50 | 20 | Failed |
| 28 | 75 | 20 | *Failed |

| Bath No. | Solderability (Contact Angle) A[1] | Solderability (Contact Angle) B[2] | Plate Composition % Ni | Plate Composition % In | Plate Appearance |
|---|---|---|---|---|---|
| 13 | 15°[1] | 30°[3] | 98.3 | 1.7 | Gray Matte |
| 14 | 15° | 30° | 85.7 | 14.3 | Bright Metallic |
| 15 | 15° | 30° | 94.2 | 5.8 | Bright Metallic |
| 16 | 15° | 30° | 95.2 | 4.8 | Bright Metallic |
| 17 | 15° | 30° | 95.7 | 4.3 | Bright Metallic |
| 18 | 15° | 30° | 93.1 | 6.9 | Bright Metallic |
| 19 | — | — | 92.1 | 7.9 | Bright Metallic |
| 20 | — | — | 90.3 | 9.7 | Bright Metallic |
| 21 | — | — | 82.0 | 18.0 | Bright Metallic |
| 22 | — | — | 80.4 | 19.6 | Bright Metallic |
| 24 | 15° | 20–30° | 99.2 | 0.8 | Bright Metallic |
| 25 | — | — | 98.3 | 1.2 | Bright Metallic |
| 26 | — | — | 98.5 | 1.5 | Bright Metallic |
| 27 | — | — | — | — | Bright Metallic |
| 28 | — | — | 99.4 | 0.6 | Bright Metallic |

*Failure was due to stress fractures in the electrodeposit.
[1]Synthetic organic acid flux manufactured and sold by Amco Inc. under the trade designation "AMCO 220-35" was used.
[2]Rosin based flux manufactured and sold by Amco, Inc. under the trade designation "AMCO 300" was used.

EXAMPLE II

A series of experiments were conducted to determine the effect of pH and current density on the indium composition of an alloy electrodeposited from baths containing the boric acid systems and citric acid system. The bath composition (1 L) and operational parameters used in the experiments with the boric acid systems are set forth in the following Table IV.

TABLE IV

| Bath Parameters | Amount |
|---|---|
| (a) Boric Acid | 35 g |
| (b) Nickel Sulfamate | 520 ml |
| (c) Nickel Chloride | 15 g |
| (d) Indium Sulfamate | 6 g |
| (e) Sodium Lauryl Sulfate | 0.05 g |
| (g) Temperature | Ambient to 45° C. |

The bath composition (1 L) and operational parameters used in experiments with the citric acid system are set forth in the following Table V.

TABLE V

| Bath Parameters | Low Citrate | High Citrate |
|---|---|---|
| (a) Citric Acid | 15.3 g | 46 g |
| (b) Nickel Sulfamate | 520 ml | 520 ml |
| (c) Diammonium Citrate | 24.7 g | 74 g |
| (d) Nickel Chloride | 15 g | 15 g |
| (e) Indium Sulfamate | 6 g | 6 g |
| (f) Sodium Lauryl Sulfate | 0.01 g | 0.01 |
| (g) Temperature | 40° C. | 40° C. |

Using the procedure of Example I, the pH of each system and the current density was varied and the effect on indium composition in the alloy was evaluated. The results for the boric system is set forth in the following Table VI and the results from the citric acid system are set forth in the following Table VII.

TABLE VI

Indium Composition, % by Wt, as a Function of pH and Current Density: Boric Acid System

| mA/cm² | Wt % Indium at Specified pH | | | |
|---|---|---|---|---|
| | 1.95[1] | 2.55[1] | 3.35[1] | 3.30[2] |
| 10 | 6.3 | (6.0/5.9/5.8) | 2.9 | 5.2 |
| 20 | 3.7 | 3.6 | 2.5 | 4.2 |
| 30 | 3.1 | 2.7 | 1.0 | 2.6 |
| 35 | 2.5 | — | 0.8 | — |
| 40 | 2.3 | — | 1.6 | 2.1 |
| 45 | — | 1.9 | — | — |
| 50 | 2.1 | — | 0.8 | (2.1/1.7) |
| 60 | — | 1.6 | — | — |

[1]Conducted at ambient temperature.
[2]Conducted at 45° C.

TABLE VII

Indium Composition, % by Wt, as a Function of pH and Current Density; Citric Acid System

| mA/cm² | Wt % Indium at Specified pH | | | | | |
|---|---|---|---|---|---|---|
| | 1.80 | 2.15* | 2.25 | 2.75* | 2.80 | 3.75 |
| 10 | 17.5 | 10.8 | 6.7 | 2.9 | 1.3 | 0.3 |
| 20 | 10 | — | 3.3 | 1.6 | — | — |
| 25 | — | 3.4 | — | — | 0.8 | 0.3 |
| 30 | — | — | 1.9 | 1.7 | — | — |
| 35 | 4.1 | — | 1.7,1.8 | 1.2 | — | 0.4 |
| 40 | — | 2.4 | 1.8 | — | 0.7 | — |
| 45 | — | — | — | 1.1 | — | 0.5 |
| 50 | 2.3 | 1.9 | 1.7 | — | — | 0.5 |
| 55 | — | — | — | 0.8 | 0.7 | — |
| 65 | 1.7 | — | 1.5 | — | — | 0.5 |
| 70 | — | — | — | — | 0.6 | — |
| 75 | — | — | — | 1.0 | — | — |
| 80 | 1.4 | 3.4 | — | — | — | — |
| 85 | — | — | — | — | 0.5 | — |
| 90 | 1.2 | — | — | — | — | — |
| 95 | — | — | — | — | — | 0.6 |
| 98 | — | 1.7 | — | 1.3 | 0.6 | — |

*Low Citrate bath

EXAMPLE III

Referring now to the drawings, FIGS. 1–10 illustrate the sequence of the process steps in accordance with a preferred embodiment of this present invention for use of the nickel/indium alloy of the invention in the manufacture of printed circuit boards beginning with the basic process material and ending with the finished product, which is a double-sided printed circuit board with copper circuits, plated through-holes and optionally of gold edge contact areas in which the nickel/indium alloy of this invention is a total or partial replacement for gold.

The basic starting material is shown in FIG. 1 and consists of a commercially available laminated board 10. Board 10 consists of substrate 12 composed of an electrically non-conductive material as for example fiber glass reinforced epoxy resin or a thermo-plastic material. Substrate 12 is laminated with an extremely thin copper clad or film 14 and 16 on opposite sides thereof. Copper film 14 and 16 have a thickness of about 0.00356 cm while the substrate has a thickness of approximately 0.157 cm.

Figure 2:
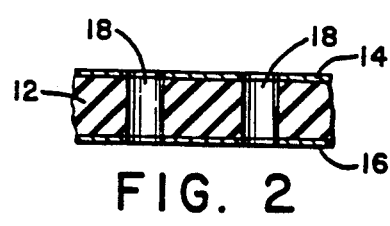

Holes or apertures 18 are formed through laminated board 10 at predetermined locations where plated through-holes are required. Holes 18 are illustrated in FIG. 2 and may be formed, for example, by drilling a tape controlled drilling machine. Board 10 may be supported during the drilling process by either aluminum of a paper phenolic entry and exit material. After drilling, board 10 is cleaned.

It is desirable, initially, to sensitize the whole of board 10 and the exposed surfaces of substrate 12 at drilled holes 18. This may be effected by dipping board 10 in a suitable catalyst, such as palladium tin chloride.

Figure 3:
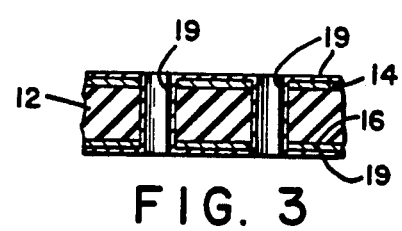
Figure 8:
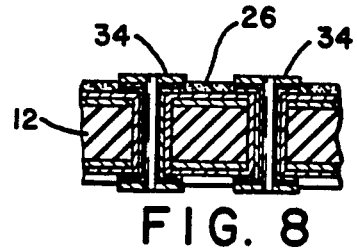

Subsequently, a thin film or layer of copper 19 is plated over board 10 by conventional electroless plating means. This may, for example, be effected by electroless copper plating to provide a film approximately 0.000254 cm thick. Layer 19 also covers the surfaces of the holes 18, as shown in FIG. 3.

The desired circuit images on both sides of board 10 may be applied by any conventional means. Preferably, however, a dry film photoresist is applied, and subsequently exposed and developed. To this end board 10 is initially cleaned. This may be effected by a sander or by a brush having fiber bristles and pumice. Subsequently, board 10 may receive a deionized or distilled water rinse, and may be dried by filtered compressed air.

A dry film photoresist layer 20 and 22 is applied to opposite surfaces of board 10. The photoresist layer may, for example, consist of DuPont Ristom 218R ®. The photoresist layers may be applied by passing the resist and board through a laminator. This may be effected at a temperature between 104.5° C. and 124° C., depending upon the type of laminator utilized. The thickness of the photoresist layers 20 and 22 is determined by the desired thickness of the plated circuit. Normally, photoresist layers 20 and 22 are somewhat thicker, may be about 0.000762 cm thicker than the desired thickness of the plated circuit. By way of example, to achieve a plated circuit of approximately 0.00381 cm thickness, photoresist layers 20 and 22 should have a thickness of about 0.00457 cm.

Figure 4:
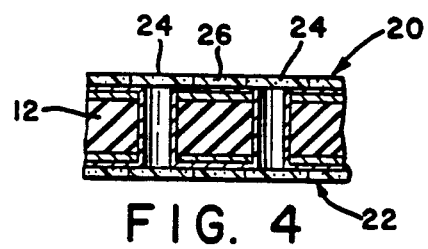

Thus-applied or laminated photoresist layers 20 and 22 are then photographically exposed through a suitable mask. Subsequently, photoresist layers 20 and 22 are developed. This will remove non-polymerized areas 24 which are susceptible to the developer. Areas 24 on photoresist layers 20 and 22 correspond to the areas of the circuits to be plated and to the surfaces of holes 18. Photoresist layers 20 and 22 then have polymerized areas 26 which are resistant to the etchant and which cover all other areas of photoresist layers 20 and 22 as shown in FIG. 4. Photoresist layers 20 and 22 may be exposed by a light source in a vacuum of 77.97 kPa of mercury or more for a time of approximately one and one-quarter minutes. Following exposure, the vacuum is released and photoresist layers 20 and 22 normalized at room temperature for at least 30 minutes. Then photoresist layers 20 and 22 may be developed in a suitable processor.

Figure 5:
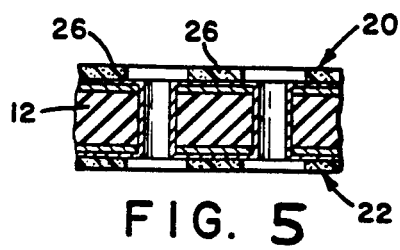

FIG. 5 illustrates board 10 after non-polymerized areas 24, which are susceptible to the developer, have been removed. This may, for example, be effected by immersion in a suitable developing solution which exposes holes or apertures 18 and the desired circuit images on both sides of the board.

Figure 7:
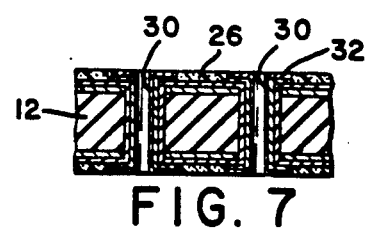

Board 10 is then electroplated with copper, pattern plating, so as to provide a required thickness of copper in the circuit image and on the inside surfaces of the drilled holes, all in the conventional manner. For example, pyrophosphate or acid copper processes may be used to achieve a minimum copper plating 30 (see FIG. 7) of 0.00254 cm over the surfaces of holes 18 and copper circuit 32 of approximately 0.00381 cm. The circuit plating 32 is contained within the boundary of the walls of polymerized photoresist 26 as shown in FIG. 7.

After the electro-copper plating step and on removal from the electroplating pattern plating bath, board 10 is washed with water in a dragout bath, water rinsed, subjected to an anti-tarnish treatment, e.g. in IMASA Cu-56 (Trade Mark) for about 1 to 2 minutes at about 20° to 25° C., water rinsed and dried. Exposed copper layers 30 and 32 are then cleaned for about 2 minutes in a micro-etch acid cleaner at about 20°-25° C., board 10 is rinsed in water for about 1 minute and in deionized water for about 25 minute. The exposed copper layers 30 and 32 are then electro plated with a nickel/indium alloy containing from about 0.3 to about 10 weight percent indium based on the total weight of the alloy and preferably from about 1 to about 3 weight percent indium on the aforementioned basis using the general procedure described in Example I. The panel electroplating bath used and operational parameters are as set forth in the following Table VIII.

TABLE VIII

| Operational Parameters | Amount |
|---|---|
| (a) Citric acid | 0.2 M |
| (b) Nickel Sulfamate | 1.3 M |
| (c) Diammonium Citrate | 0.4 M |
| (d) Nickel Chloride | 0.063 M |
| (e) Indium Sulfamate | 0.0089 M |
| (f) Sodium Lauryl Sulfate | 0.0004 M |
| (g) Temperature | 45-48° C. |
| (h) pH | 2.3 |
| (i) Current density | 35 mA/cm$^2$ |

Figure 9:
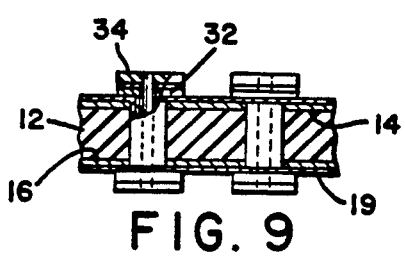

On removal from the nickel/indium electroplating bath, board 10 is washed with water in a dragout bath for about 10 seconds and then in a hot water bath for about 1 minute, rinsed in water and dried. Photoresist 26 is then removed by immersing board 10 in a first bath of alkaline solvent stripper, e.g., Robertsons EP-118, for about 10 minutes at about 60°-70° C., in a second bath of alkaline solvent stripper for about 5 minutes at about 60°-70° C. and passing board 10 through a hot alkaline solvent stripping brush machine at about 50° C. as shown in FIG. 9. Board 10 is then etched in conventional manner using an ammoniacal etchant, e.g., MacDermid 9151, at about 45° C. to remove copper from the areas of board 10 not covered by the nickel/indium etch resist care being taken to maintain the etchant within its normal operating limits and to avoid over-etching which can result in the edges of copper layers 30 and 32 becoming undercut to such an extent that slivers of the nickel/indium alloy, which acts as an etch resist during etching, can break off and contaminate the printed circuit. After etching, board 10 is rinsed in water, dried and masked for plating of the edge contact area only.

The edge contacts can be provided either by simply plating copper layers 30 and 32 in the edge contact area with gold to the required thickness using conventional electroplating techniques. Alternatively, as is described in my copending U.S. patent application Ser. No. 605,435, filed Apr. 30, 1984, entitled "Novel Nickel/Indium Alloy For Use in the Manufacture of Electrical Contact Areas of Electrical Devices", nickel/indium alloy preferably containing from about 5 to about 20 weight percent indium based on the total weight of the alloy can be plated onto layers 30 and 32 to a required thickness to form the edge contacts 33, or such contacts can be formed by first plating copper layers 30 and 32 in the edge contact area 33 with nickel/indium alloy as aforesaid to increase the thickness thereof on the layer 30 and 32 in the edge contact area 33 and then plating with gold.

Figure 10:
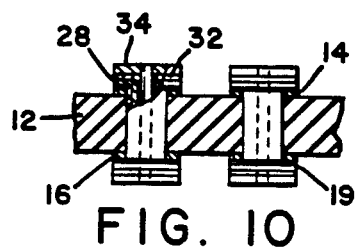

The finished plated through-hole printed circuit board is illustrated in FIG. 10 which can be used as a conventionally produced printed circuit board, e.g. it can have a solder mask applied thereto and components mounted thereon by a flow soldering technique.

What is claimed is:

1. In an improved method of preparing a printed circuit board from a metal clad substrate which comprises:
   (a) covering at least one of the surfaces of the metal clad substrate with a coating of photoresist;
   (b) masking the photoresist with a predetermined circuit design image;
   (c) exposing the photoresist to a source of energy to provide a resist layer portion susceptible to a etchant over a desired circuit image on at least one of said surfaces, and a resist layer portion resistant to said etchant over the remainder of said surfaces;
   (d) removing those portions of the photoresist which are susceptible to the etchant to provide the desired circuit image on at least one of said surfaces of the metal cladding;
   (e) electroplating the desired circuit image with a metallic etch resist;
   (f) removing the remaining portions of the photoresist from said board exposing a portion of the metal cladding; and
   (g) removing the exposed metal cladding from the board to provide a board having metal circuit covered by a metallic etch resist, said improvement comprising a metallic etch resist composed of a nickel/indium alloy containing from about 0.1 to about 10 weight percent indium based on the total weight of the alloy.

2. A method according to claim 1 which further comprises:
   (i) electroless metal plating at least one of said surfaces of said metal clad substrate prior to step (a) of covering at least one of said surfaces of said metal clad substrate with said photoresist; and
   (ii) electrolytic metal plating said circuit image after removing said portions of said photoresist which are susceptible to said etchant prior to step (e) of electroplating said desired circuit image with a metallic etch resist.

3. A method according to claim 1 which further comprises electroless metal plating at least one of said surfaces of said substrate, and thereafter electrolytically metal plating said surfaces prior to step (a) of covering said surfaces with said photoresist.

4. A method according to claim 3 for manufacturing an electrical circuit board having plated through holes for electrically inter-connecting circuits on opposite surfaces of said board which further comprises forming apertures through said substrate at the locations of the desired plated through holes prior to electroless metal plating and electrolytically metal plating at least one of surfaces, and thereafter electroless metal plating the exposed surfaces of said apertures and opposite surfaces of said substrate, and electrolytically metal plating said surfaces of said apertures and said opposite surfaces of said substrate prior to step (a) of covering at least one of said surfaces of said substrate with said protective material.

5. A printed circuit board prepared in accordance with the process of claim 1.

6. A printed circuit board according to claim 5 wherein said alloy contains from about 0.3 to about 9 weight percent indium.

7. A printed circuit board according to claim 5 wherein said alloy contains from about 0.5 to about 7 weight percent indium.

8. A printed circuit board according to claim 7 wherein said alloy contains from about 1 to about 4 weight percent indium.

9. An improved process according to claim 1 wherein said alloy contains from about 0.3 to about 9 weight percent indium.

10. An improved process according to claim 9 wherein said alloy contains from about 0.5 to about 7 weight percent indium.

11. An improved process according to claim 10 wherein said alloy contains from about 1 to about 4 weight percent indium.

12. In an improved method of manufacturing printed circuit boards of the type which comprises the steps of:
    (a) electroless metal plating a metal plate onto at least one surface of a substrate composed of an insulating material;
    (b) applying to a portion of said metal plate a protective material to provide the desired circuit pattern on at least one surface of the electrolessplated metal;
    (c) electroplating the desired circuit pattern with a metal plating;
    (d) electroplating the desired circuit pattern with a metallic etch resist;
    (e) removing said protective material from said metal plated substrate; and
    (f) differentially etching said metal from a portion of metal cladding covered by said protective material to provide a board having the desired metal circuit pattern on at least one surface thereof; wherein the improvement comprises a metallic etch resist of a nickel-indium alloy containing from about 0.1 to about 10 weight percent indium by weight of the alloy.

13. A printed circuit board prepared in accordance with the procedure of claim 12.

14. A printed circuit board according to claim 13 wherein said alloy contains from about 0.3 to about 9 weight percent indium.

15. A printed circuit according to claim 14 wherein said alloy contains from about 0.5 to about 7 weight percent indium.

16. A printed circuit board according to claim 15 wherein said alloy contains from about 1 to about 4 weight percent indium.

17. An improved process according to claim 12 wherein said alloy contains from about 0.3 to about 9 weight percent indium.

18. An improved process according to claim 17 wherein said alloy contains from about 0.5 to about 7 weight percent indium.

19. An improved process according to claim 18 wherein said alloy contains from about 1 to about 4 weight percent indium.

* * * * *